United States Patent [19]

Lin et al.

[11] Patent Number: 4,585,342

[45] Date of Patent: Apr. 29, 1986

[54] SYSTEM FOR REAL-TIME MONITORING THE CHARACTERISTICS, VARIATIONS AND ALIGNMENT ERRORS OF LITHOGRAPHY STRUCTURES

[75] Inventors: Burn J. Lin, Scarsdale; Yuan Taur, Armonk, both of N.Y.

[73] Assignee: International Business Machines Corporation, Armonk, N.Y.

[21] Appl. No.: 626,496

[22] Filed: Jun. 29, 1984

[51] Int. Cl.[4] .......................... G01J 1/06; G01B 9/00
[52] U.S. Cl. ................................... 356/124; 356/121
[58] Field of Search ...................... 356/121, 124, 124.5, 356/127

[56] References Cited

U.S. PATENT DOCUMENTS

| | | | |
|---|---|---|---|
| 4,099,877 | 7/1978 | Brouwer | 356/124 |
| 4,281,927 | 8/1981 | Dzuban | 356/124 |
| 4,498,767 | 2/1985 | McGovern et al. | 356/121 |

FOREIGN PATENT DOCUMENTS

| | | | |
|---|---|---|---|
| 2110045 | 10/1971 | Fed. Rep. of Germany | 356/124 |
| 0094032 | 5/1984 | Japan | 356/124.5 |

Primary Examiner—R. A. Rosenberger
Attorney, Agent, or Firm—John J. Goodwin

[57] ABSTRACT

A system for evaluating and measuring the performance of lithographic structures, and more particularly for monitoring the optical parameters of a projection lithography system which uses the instant electrical readout from an array of photosensitive detectors fabricated on a silicon wafer in combination with a computer for real-time characterization of lithographic devices and the evaluation of optical E-beam, ion-beam and X-ray parameters. The system includes a source radiation, such as a source of ultraviolet light, a projection mask which masks the illumination from the source. The illumination is then directed through a projection lens onto a semiconductor wafer mounted on an x-y stepping table. A standard digital data processor is provided to control the x-y drive mechanism for the stepping table. The computer also controls a Z drive mechanism for movement in a vertical direction. The semiconductor wafer contains a plurality of radiation detectors which are responsive to the radiation from the source. These detectors use a conventional power supply controlled by the computer, and employ an output signal means which obtains the radiation produced output signals from the detectors and applies them to the computer. The use of a unique mask with the radiation-sensitive detectors is employed in combination with compiling means for the purposes of evaluating image projection from a lithographic system, including the properties of intensity, modulation transfer function (MTF), focus and alignment.

10 Claims, 12 Drawing Figures

MASK FUNCTION

DETECTOR OUTPUT

LINE INTENSITY PROFILE

SYSTEM FOR REAL-TIME MONITORING THE CHARACTERISTICS, VARIATIONS AND ALIGNMENT ERRORS OF LITHOGRAPHY STRUCTURES

BACKGROUND OF THE INVENTION

1. Field of the Invention

The present invention relates to systems for evaluating and measuring the performance of lithographic structures, and more particularly to a system for monitoring the optical parameters of a projection lithography system which uses the instant electrical readout from an array of photosensitive detectors fabricated on a silicon wafer in combination with a computer for real-time characterization of lithographic devices and the evaluation of optical E-beam, ion-beam and X-ray parameters.

2. Description of the Prior Art

The general use of photosensitive detectors fabricated on silicon to monitor optical systems has been described in the prior art. A list of typical prior art references is as follows:

DiStefano IBM Technical Disclosure Bulletin, Vol. 23, No. 12, May 1981, at page 5601.
Foisy et al, IBM Technical Disclosure Bulletin, Vol. 25, No. 7B, Dec. 1982 at page 3654.
Chi et al, IBM Technical Disclosure Bulletin, Vol. 25, No. 10, March 1983 at page 5052.
Jacobus et al, IBM Technical Disclosure Bulletin, Vol. 13, No. 8, Jan. 1971 at page 2322.
U.S. Pat. No. 4,329,049
U.S. Pat. No. 3,938,894
U.S. Pat. No. 4,281,927
U.S. Pat. No. 4,354,104
U.S. Pat. No. 3,969,751
U.S. Pat. No. 3,988,774
U.S. Pat. No. 4,184,894
U.S. Pat. No. 4,021,844.

The DiStefano publication describes a method for doing optical detection on a silicon detector device. The detector consists of a plurality of detector cells each containing two p-n junction elements.

The U.S. Pat. No. 4,329,049 patent teaches the use of an electrically scanning linear photodiode array in combination with a computer for determining the refractive properties of a lens.

The U.S. Pat. No. 3,938,894 patent discloses the use of a plurality of photodiodes on a substrate to detect the focus condition of a lens.

The Foisy et al publication shows a means for the measurement of the modulation transfer function of image sensing photodiode arrays.

The Chi et al publication discloses an optical method to replace electrical device testing.

The U.S. Pat. No. 4,281,927 patent teaches a focusing technique utilizing a photocell which is scanned by a rotating disc.

The other remaining patents and publications disclose other photodiode and photoconductor structures including the use of light-shielding means.

What is different in the present invention over the prior art is the use of a unique mask with the radiation-sensitive detectors in combination with compiling means for the purposes of evaluating image projection from a lithographic system, including the properties of intensity, modulation transfer function (MTF), focus and alignment.

SUMMARY OF THE INVENTION

An object of the present invention is to provide a system for monitoring the optical parameters of a projection lithography system which uses the instant electrical readout from an array of photosensitive detectors fabricated on a silicon wafer.

Another object of the present invention is to provide a monitoring system using a matrix array of photovoltaic diodes or photoconductors on a chip in combination with a computer for real-time characterization of lithographic devices and the evaluation of optical E-beam, ion-beam and X-ray parameters.

Still another object of the present invention is to provide a monitoring system using a unique mask with the photosensitive detectors for the purposes of evaluating light projection from a lithographic system, including the properties of intensity, MTF, focus and alignment.

A further object of the present invention is to provide a system for automatic rapid characterization and evaluation of optical lithography tools and which is also applicable to other lithography systems such as X-ray and E-beam.

The foregoing and other objects, features and advantages of this invention will be apparent from the following more particular description of the invention as illustrated in the accompanying drawings.

DESCRIPTION OF THE PREFERRED EMBODIMENT

Figure 1:
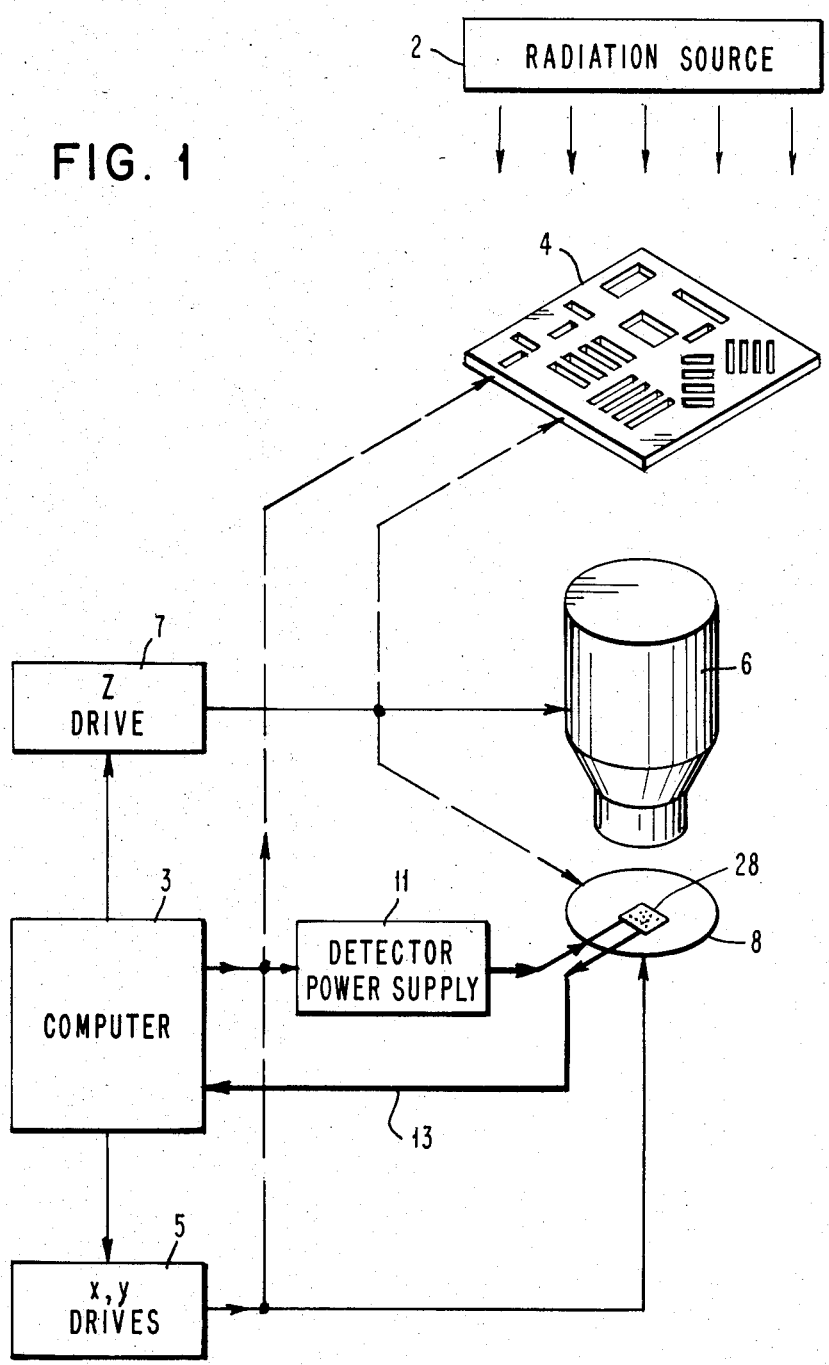
FIG. 1 is a system block diagram which schematically illustrates a real-time monitoring system for lithography structures according to the principles of the present invention.

To evaluate the performance of an optical lithography system, a number of parameters such as intensity distribution, lens distortion, reduction factor, lens modulation transfer function (MTF) at all field positions, alignment errors, focus control, and linewidth distribution have to be evaluated. A typical technique for providing such evaluations includes performing a photoresist exposure and development using specially designed mask patterns to be used for evaluation purposes. After such an imaging process, the wafer is either subjected to an optical inspection or is further processed to form electrically measurable patterns. The former procedure is often extremely time consuming whereas the latter technique significantly reduces the time required for data collection, it still requires a substantial amount of processing.

In the present invention, a technique is described to monitor the optical parameters of a projection lithography system employing instant electrical readout from an array of photosensitive detectors fabricated on a silicon wafer, thus avoiding the heretofore time-consuming sequence of exposure, development, and examination of test patterns. A small computer is employed to process the data from each sensor in order to extract the aforementioned parameters.

In addition to the lithographic application, the present invention takes advantage of integrated circuit technology to revolutionize lens testing for any lenses besides those used in projection aligners. Instead of using optical benches and knife edge scan at a limited number of spots in the lens field, the entire field can now be covered with a matrix of detectors ready to be scanned accurately with a precision linear motor or a laser table.

The present invention is described with reference to FIG. 1, which illustrates a system including a source radiation 2, such as a source of ultraviolet light, a projection mask 4 which masks the illumination from source 2 and which is directed through a projection lens 6 onto a semiconductor wafer 28 mounted on an x-y stepping table 8.

A computer 3, which is a standard digital data processor, is provided to control the x-y drive mechanism 5 for the table 8. Computer 3 also controls a Z drive mechanism for movement in a vertical direction. As will be later described, the Z drives 7 may be alternatively connected to move the projection lens 6, the wafer 8 or the mask 4. Likewise, the x-y drive 5 may be equally applied to the mask 4 or the wafer 28 since it is the relative movement between the three structures that is desired. For example, lens 6 may be moved and mask 4 may be stationary or vice versa. Mechanisms to move structural elements in x, y or z directions in response to electrical control signals are well-known in the art.

As will be later described, wafer 28 contains a plurality of radiation detectors which are responsive to the radiation from source 2. These detectors use a conventional power supply 11 controlled by computer 3, and the output signal from the detectors are connected to the computer by means of conductors 13.

Figure 2:
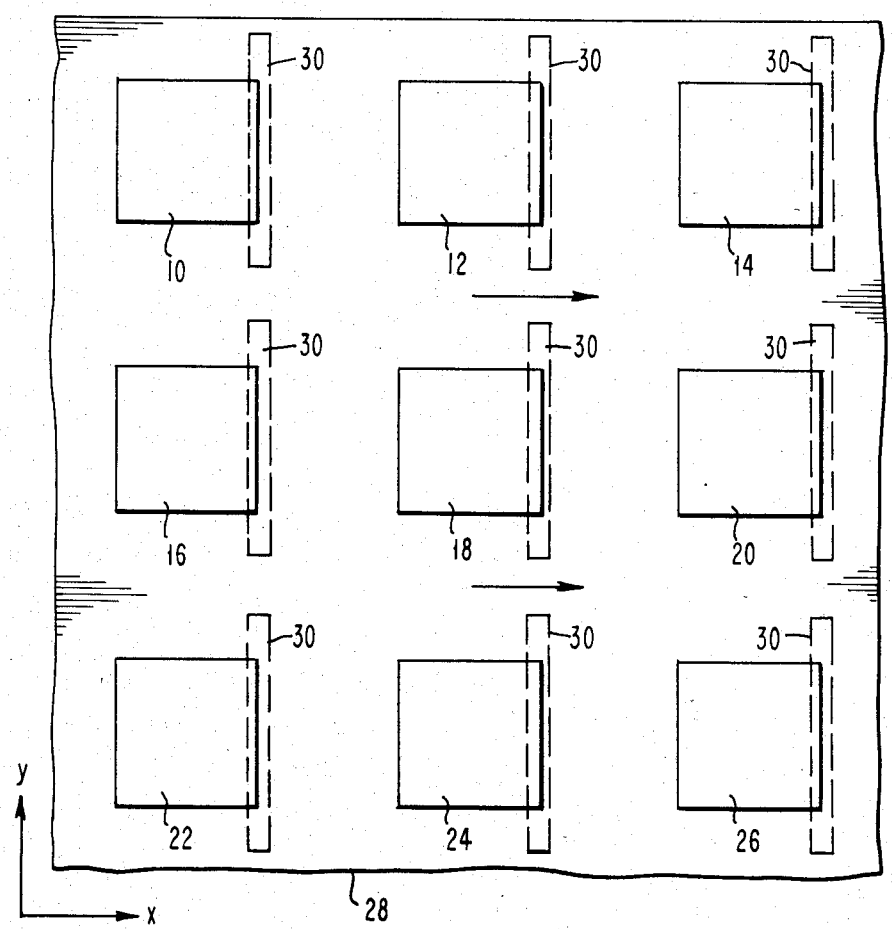
FIG. 2 schematically represents the matrix of photosensitive detectors in combination with a special-purpose mask which may be used in the system of FIG. 1.
Figure 6:
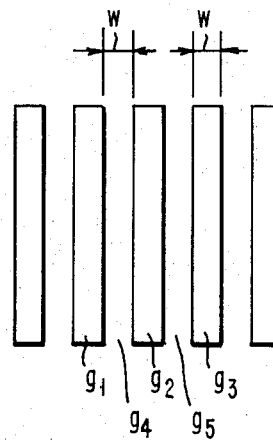
FIG. 6 is a schematic illustration of an alternate MTF measurement scheme used in the present invention.
Figure 3:
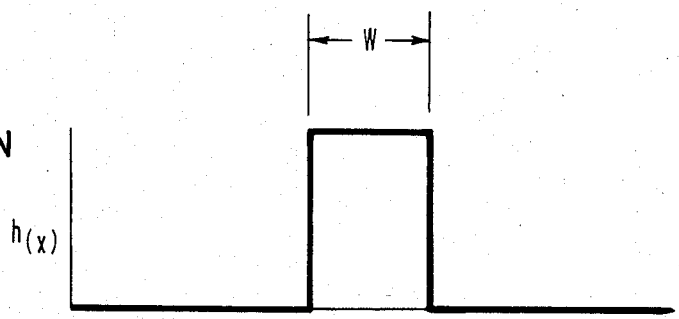
FIGS. 3, 4 and 5 illustrate a series of waveforms useful in explaining the operation of the matrix of photosensitive detectors depicted in FIG. 2.
Figure 4:
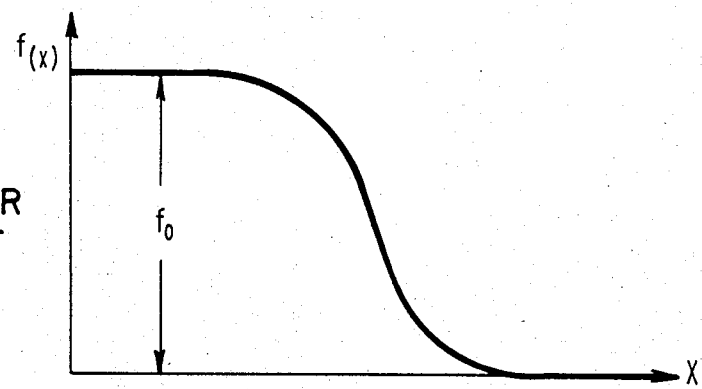
Figure 5:
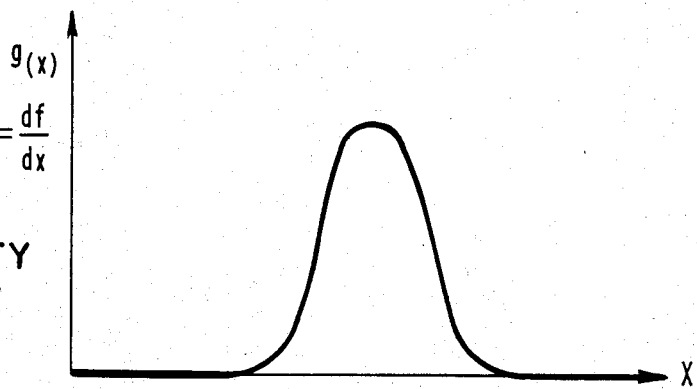

FIG. 2 schematically depicts a plurality of identical photosensitive detectors 10, 12, 14, 16, 18, 20, 22, 24 and 26 disposed on the semiconductor wafer 28 shown in FIG. 1, where each detector has a square area with dimensions on the order of 100 $\mu m \times 100$ $\mu m$ evenly spaced across the wafer. Each of the photosensitive detectors may be photodiodes or photoconductors. At first, the relative sensitivity and area of the detectors are calibrated by stepping each of them to the same field location by means of the conventional x-y system stepping apparatus shown in FIG. 1, such as a precision linear motor or a laser table which moves wafer 28 relative to a given field location (to ensure the same intensity) and recording the output. Then, with all the detectors staying in place, the intensity distribution of the field illumination can be mapped out. In order to measure MTF, a special-purpose mask consisting of 0.5 $\mu m$ to 5 $\mu m$ wide lines (openings) in both directions is used to project images 30 shown as dotted lines in FIG. 2. Images 30 are chosen to be vertical as an example. A similar set of horizontal line openings are used to evaluate the lithographic parameters in the y direction. Referring to FIGS. 3, 4 and 5, curve 3 represents the step function produced by the mask. The output from each detector of FIG. 2 is recorded simultaneously as a function of displacement when the line image 30 is moved across the detector edge. The result may look like f(x) shown in FIG. 4. It is then straightforward to re-construct the intensity profile of the line image $g(x) = df(x)/dx$, as in FIG. 5. If the detector dimensions and response characteristics have been pre-calibrated, the mask linewidth W can also be determined from the output $f_o$ when the line is well inside the square area. For an incoherent system, the x-direction MTF is given by $$MTF(f_x) = G(f_x)/H(f_x),$$

where $G(f_x)$, $Hf(f_x)$ are the Fourier transforms of $g(x)$ and the rectangular mask function $h(x)$, respectively. Similarly, $MTF(f_y)$ can be evaluated using y-direction (i.e., horizontal) lines on the same mask. This Fourier technique assumes completely incoherent illumination. Therefore, the aperture of the condenser has to be completely opened to assimilate the incoherent condition. After the incoherent MTF is evaluated, the MTF at the actual condenser setting can be calculated theoretically using well-known formulae. An alternate method to evaluate the MTF of the actual condenser setting is to scan a set of equal lines and spaces as shown in FIG. 6 where the linewidth W depends on the spatial frequencies of interest. The intensity measured in the central portion of the patterns such as $(g_1+g_2+g_3)/3 = g_{max}$ and $(g_4+g_5)/2 = g_{min}$ can be used to evaluate the MTF at the particular spatial frequency ($f_w$) and field locations (u,v) by the formula $$MTF(f_w,u,v) = \frac{g_{max}(f_w,u,v) - g_{min}(f_w,u,v)}{g_{max} + g_{min}}$$

In principle, the intensity at the center of any inside lines such as $g_1$, $g_2$, or $g_3$ can be taken as $g_{max}$. The averaging is done to minimize measurement errors due to noise and other practical imperfections. The two outside lines are excluded from the calculation because of a different proximity condition, To find the focus conditions across the field, the above-described procedures are repeated for different vertical positions (i.e., positions in the Z direction parallel to the optical axis as shown in FIG. 1) of the wafer and the sharpest image at each location is determined. As previously stated, the wafer, the lens 6 or the mask 4 can be moved to the vertical positions. Lens distortion and reduction error is also determined by comparing the relative positions of the line profile among detectors during the MTF measurement. It is straightforward to predetermine both the distance between the detector edges and the distance between the lines on the mask using existing measurement tools that are equipped with laser interferometric tables. Alternately, when a step-and-repeat aligner is being tested, the detector location is calibrated by stepping each detector across a particular mask image. Using the second method, detector displacement due to chucking variations can be eliminated.

Many alignment situations can be studied using this matrix of detectors. Chucking variations can be evaluated by determining the detector position using the on-chuck calibration method just discussed to compare with a second reading after the wafer with all the detectors is released and rechucked. Alignment errors due to temperature variations and changes of the mask-to-lens distance can be obtained instantly, once the wafer with the detectors is chucked securely and calibrated.

Figure 7:
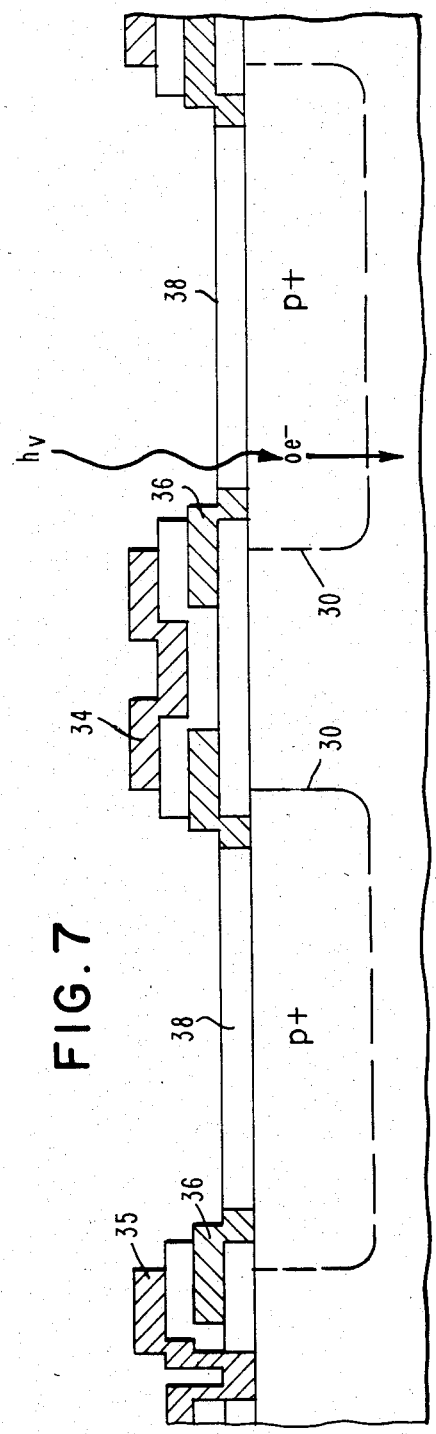
FIGS. 7 and 8 are schematic illustrations of cross sections of a photodiode structure which may be used in an embodiment of the present invention.
Figure 9:
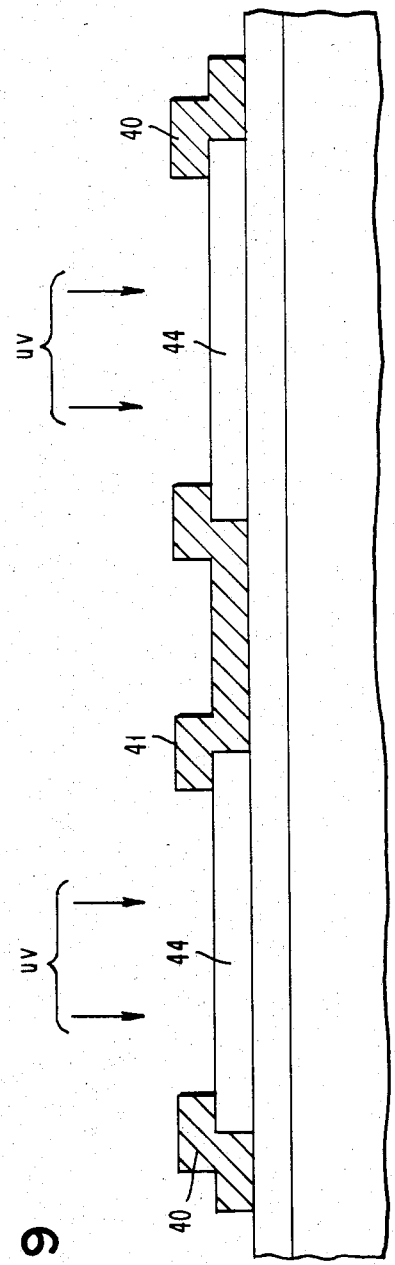
FIG. 9 and 10 are schematic illustrations of cross sections of a photoconductor structure which may be used in an embodiment of the present invention.
Figure 11:
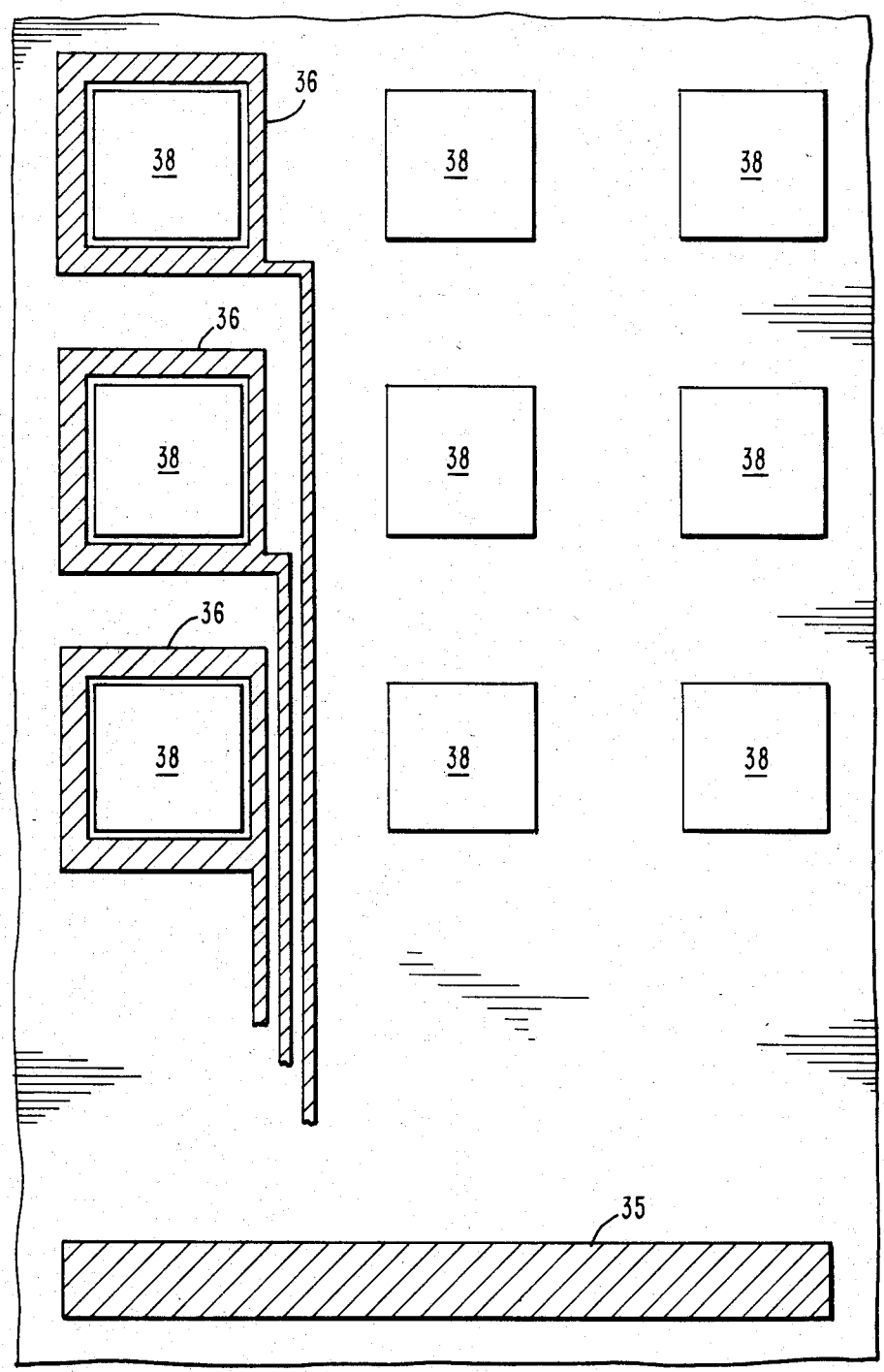
FIG. 11 is a plan view illustrating the layout of the photodiode structure shown in FIG. 7.
Figure 12:
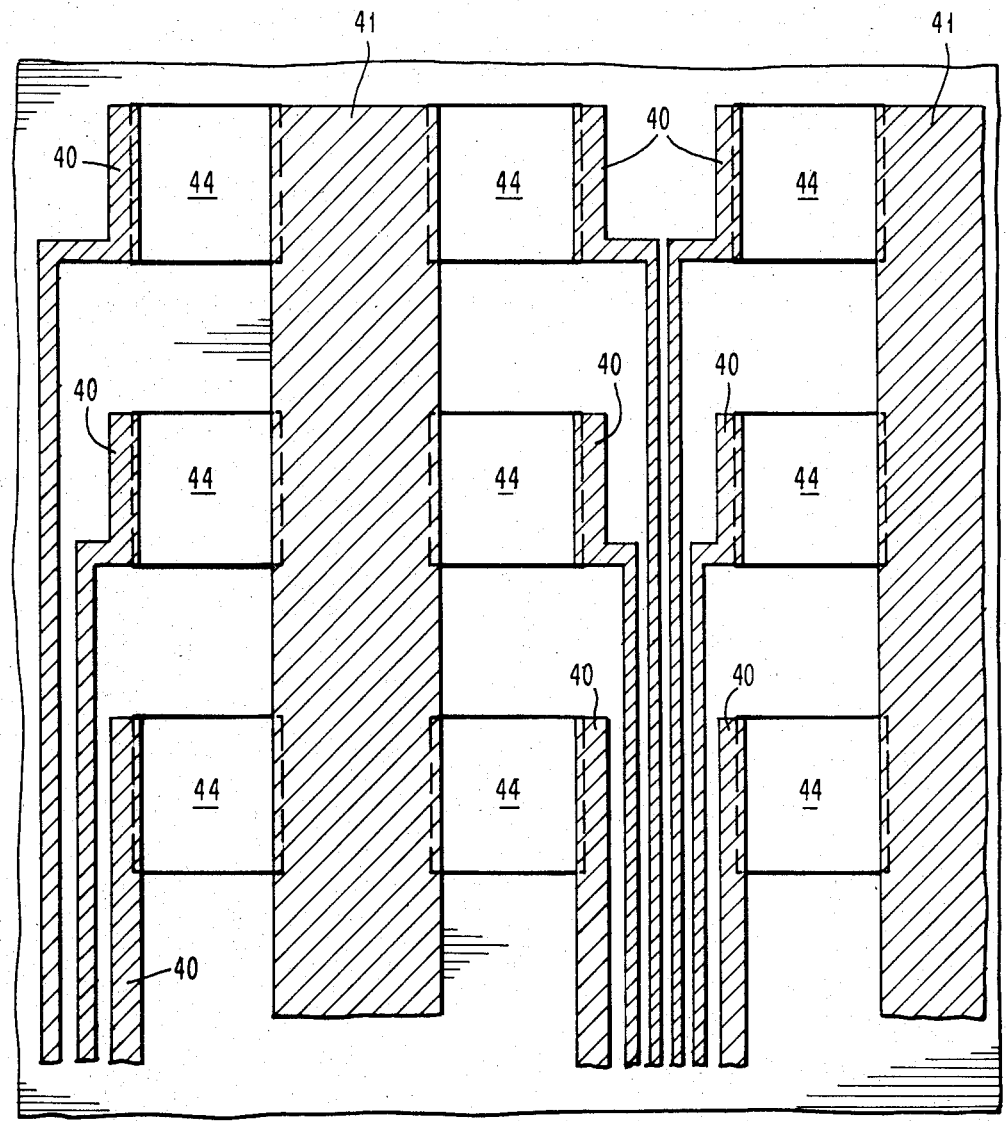
FIG. 12 is a plan view illustrating the layout of the photoconductor structure shown in FIG. 9.

Two embodiments for the fabrication of an array of UV-sensitive detectors on a silicon wafer according to the principles of this invention will be described. In one embodiment, the detectors are ion-implanted photovoltaic diodes and in another embodiment, the detectors are formed of deposited films of photoconductor such as polysilicon insulated from the substrate. A photodiode can be operated at zero bias followed by a transconductance amplifier to read the junction current which is proportional to the number of photons absorbed in the detector area. A schematic structure is shown in FIG. 7 where the diodes are formed by selective implantation of $p^+$-regions 30 in an n-type substrate 32. The junction depth should be much greater than the inverse of the UV absorption coefficient ($\alpha$) of silicon in order to avoid crosstalk due to holes generated below the junction and collected by the adjacent detectors. For 400 nm UV light, $\alpha$ is approximately $5 \times 10^4$ cm$^1$ and a junction of $\sim 1$ $\mu$m adequate. After forming the diodes, two levels of metallization 34 and 36 are used. The first level 36 is to make contact to extract electric signal and to define the optical area; the second level 34 is used to shield the n-region between the devices from UV radiation. Metallization segment 35 is formed at the second level, however, it makes contact with the silicon substrate. The diffraction effect due to the edge of the first metal is negligible since it is within 0.5 $\mu$m from the strong absorption region of the detector. The oxide 38 thickness over the $p^+$ area can be chosen so that more than 85% of the incident light energy is absorbed in silicon. A plan view of the photodiode structure of FIG. 7 is shown in FIG. 11 wherein the photo-induced current between the elements 36 and region 35 is measured. For the case of a photoconductor array, a schematic cross section is the embodiment of the photoconductor array as shown in FIG. 9 where only one level of metallization 40 is required. The metal 40 and the photoconductor 44 are disposed over the substrate. The photoconductors 44 are formed of polysilicon. A plan view of the photoconductor structure of FIG. 9 is shown in FIG. 12 wherein resistance is measured between elements 40 and 41.

In a typical lithographic system, the UV intensity is of the order of 100 mW/cm$^2$, which is equivalent to a photon flux of $2 \times 10^{17}$/sec-cm$^2$ on the detector. The photoinduced current from a 1 $\mu$m $\times$ 100 $\mu$m line image is then $3 \times 10^{-8}$ A, well above the diode and amplifier noise limits. Furthermore, only one video amplifier is needed to process all the parallel detector signals if they are converted into a serial output using either on-chip or off-chip MOS switches driven by a clocked shift register. Such a photodetector array, when a plan view of the photodiode structure of FIG. 7 is shown in FIG. 11 interfaced to a mini-computer, provides a very useful tool in characterizing an optical projection system.

Though optical lithography is used as an example, the present invention applies as well to X-ray lithography systems. For scanning E-beam and ion-beam lithography, as long as the detector signal is properly integrated according to the apriori knowledge of the E-beam scanning time constant, the scheme is also applicable.

Figure 8:
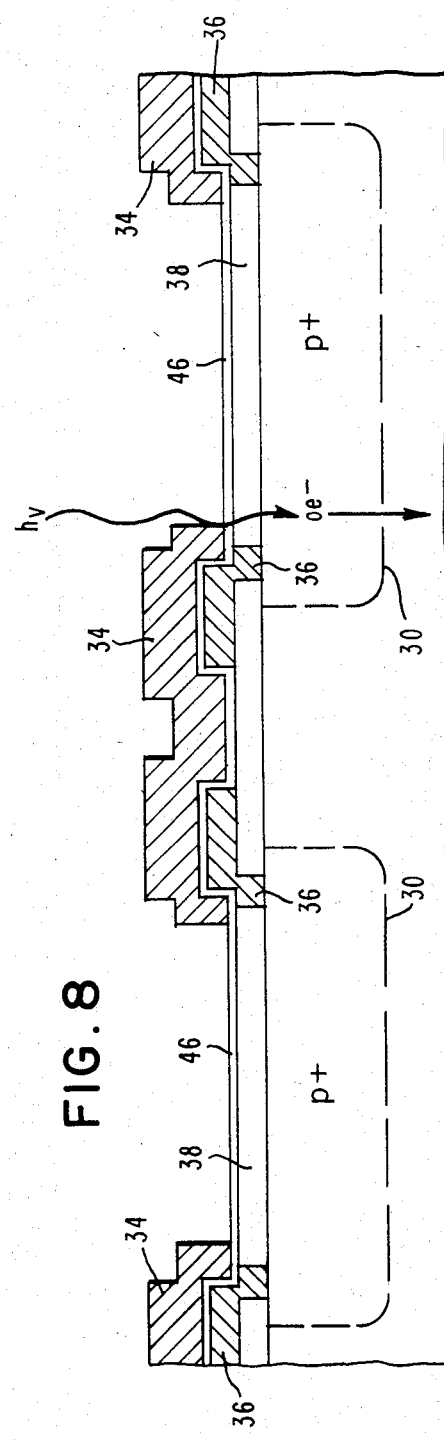
Figure 10:
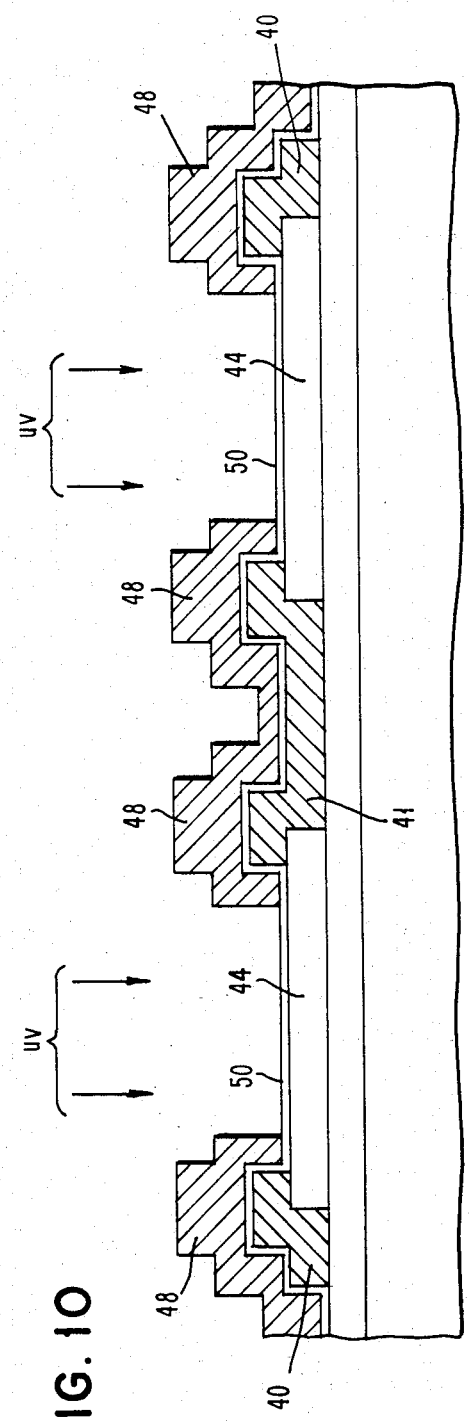

However, because of the current induced by these charged particles even at the shielding conductors such as the second metal layer in FIG. 7 and the metal layer in FIG. 9, the detector design has to be changed. For photodiodes, the light shielding first metal layer 34 should be enlarged and grounded to protect the signal collecting second metal layer 36 as shown in FIG. 8 wherein layers 34 and 36 are separated by insulation 46. For photoconductors, an additional shielding metal layer 48 separated from layer 44 by insulator layer 50 as shown in FIG. 10 is required.

Having thus described our invention, what we claim as new, and desire to secure by Letters Patent is:

1. A system for real-time monitoring the characteristics of lithographic structures comprising lithographic projection means including a radiation source and radiation focussing means for projecting focussed radiation onto a desired plane, a plurality of radiation sensitive detectors arranged in a matrix on a silicon wafer disposed in said desired plane, said detector producing an electrical output signal in response to radiation thereon, means for sequentially changing the relative position between said silicon wafer and said radiation source and said focussing means in a direction parallel to said plane such that each one of said plurality of radiation sensitive detectors is separately disposed in sequence in the same location in the field of said projected radiation, and, means connected to each of said plurality of radiation sensitive detectors for recording the detected output signals produced by said radiation for each of said detectors when located at said same location in said radiation field for calibrating said radiation sensitive detectors.

2. A system according to claim 1 wherein said radiation is light, said lithographic projection means is a photolithographic means including a light source and light focussing means, and wherein said radiation sensitive detectors are photosensitive detectors.

3. A system according to claim 2 wherein said photosensitive detectors on said silicon wafer are ion implanted photovoltaic diodes sensitive to ultraviolet light.

4. A system according to claim 2 wherein each of said photosensitive detectors on said silicon wafer is a photovoltaic diode including ion implanted first conductivity type regions in said other conductivity type wafer to form a diode, a first layer of insulation over a said ion implanted region having openings therein to said implanted region, first and second layers of metal, said second layer of metal being disposed on said oxide and through said holes therein into contact with said ion implanted region, a second layer of insulation over said second layer of metal, and said first layer of metal being disposed over said second layer of oxide to provide a shield for said second conductivity type wafer.

5. A system according to claim 2 wherein said photosensitive detectors are films of photoconductive polysilicon deposited on said silicon wafer and responsive to ultraviolet light.

6. A system according to claim 2 wherein each of said photosensitive detectors on said silicon wafer is a photoconductor including a layer of insulation over said wafer, a layer of photoconductive polysilicon disposed on said layer of insulation, and at least one layer of metal disposed over the ends of said layer of photoconductive polysilicon and in contact with said layer of insulation.

7. A system according to claim 2 including means for recording the output signals of all of said photosensitive detectors in said focussed light radiation field at the same time for providing the intensity distribution of said light in said radiation field covering said detectors.

8. A system according to claim 7 further including a masking means disposed in the path of said focussed light radiation between said light radiation source and said matrix of photosensitive detectors on said silicon wafer, said masking means having linear apertures therein for allowing said light radiation to fall on only a selected portion of each of said photosensitive detectors as a line image, means for simultaneously recording the output signals from each of said detectors produced by said masked light radiation, means for sequentially changing the relative position of one of said wafer means and masking means with respect to said focussing means in a direction parallel to said desired plane for correspondingly displacing said line images across said detectors, said recording means recording the output signals of each of said detectors as a function of the relative displacement of said line images relative to said detectors, and, means for determining the intensity profile of said line image from said recorded light radiation signals.

9. A system according to claim 8 wherein said means for sequentially changing the relative position of one of said wafer means and masking means further includes means for changing the relative position of one of said masking means, said focussing means and said wafer means with respect to the other two of said means in a direction orthogonal to said desired plane and parallel to said light radiation, and wherein said recording means records the output signals of each of said detectors as a function of the change of relative position between said masking means focussing means and detectors in said orthogonal direction, and, means for determining the characteristics of said lithographic projection light focussing means from said output signals from said detectors recorded for said displacements in said first and second directions.

10. A system according to claim 9 wherein said wafer means is translated in the x-y plane and wherein said focussing means is subsequently moved in the Z direction orthogonal to said x-y plane.

* * * * *